US012575195B2

(12) United States Patent (10) Patent No.: US 12,575,195 B2

Masini et al. (45) Date of Patent: Mar. 10, 2026

(54) PHOTODETECTOR WITH VERTICAL ELECTRIC FIELD

(71) Applicant: Cisco Technology, Inc., San Jose, CA (US)

(72) Inventors: Gianlorenzo Masini, Carlsbad, CA (US); Kam Yan Hon, Irvine, CA (US); Fatemeh Rezaeifar Bayat, Mission Viejo, CA (US)

(73) Assignee: Cisco Technology, Inc., San Jose, CA (US)

( * ) Notice: Subject to any disclaimer, the term of this patent is extended or adjusted under 35 U.S.C. 154(b) by 688 days.

(21) Appl. No.: 17/815,115

(22) Filed: Jul. 26, 2022

(65) Prior Publication Data

US 2024/0038919 A1 Feb. 1, 2024

(51) Int. Cl.
H10F 30/223 (2025.01)
H10F 77/122 (2025.01)

(52) U.S. Cl.
CPC ......... H10F 30/223 (2025.01); H10F 77/122 (2025.01)

(58) Field of Classification Search
None
See application file for complete search history.

(56) References Cited

U.S. PATENT DOCUMENTS

| | | | |
|---|---|---|---|
| 7,397,101 | B1 | 7/2008 | Masini et al. |
| 11,049,851 | B2 | 6/2021 | Hon et al. |
| 2006/0118896 | A1 | 6/2006 | Kang et al. |
| 2021/0225922 | A1 | 7/2021 | Na et al. |
| 2021/0375959 | A1* | 12/2021 | Hung ..................... H10F 39/80 |

FOREIGN PATENT DOCUMENTS

WO 2008080428 A1 7/2008

OTHER PUBLICATIONS

NK Hon, S Sahni, A Mekis, G Masini, "Design and performance of high-speed Ge-on-Si waveguide photodiodes," IEEE, Aug. 23-25, 2017 [Abstract Only].
S. Sahni, N.K. Hon, G. Masini, "The Dual-Heterojunction Ge on Si Photodetector," Luxtera, Inc., ECS Transactions, Year: 2014, p. 783-789.
Flöry N, Ma P, Salamin Y, et al. Waveguide-integrated van der Waals heterostructure photodetector at telecom wavelengths with high speed and high responsivity. Nat Nanotechnol. 2020;15(2):118-124. doi:10.1038/s41565-019-0602-z.

* cited by examiner

*Primary Examiner* — Bo B Jang
(74) *Attorney, Agent, or Firm* — Patterson + Sheridan, LLP

(57) ABSTRACT

A photodetector includes a substrate, an optical absorber, a first doped region, a second doped region, and a third doped region. The optical absorber is disposed in the substrate and includes a first region and a second region. The first doped region is disposed in the substrate such that the first doped region contacts the second region of the optical absorber. The second doped region is disposed in the substrate such that the second doped region contacts the second region of the optical absorber. The second region of the optical absorber is positioned between the first doped region and the second doped region. The third doped region is disposed in the substrate and has an opposite doping relative to the first doped region and the second doped region. The first region of the optical absorber is positioned between the third doped region and the second region of the optical absorber.

20 Claims, 7 Drawing Sheets

Section A-A

100

Optical Signal → Photodetector → Electric Signal

102

Section A–A

Section B–B

PHOTODETECTOR WITH VERTICAL ELECTRIC FIELD

TECHNICAL FIELD

Embodiments presented in this disclosure generally relate to optical communications. More specifically, embodiments disclosed herein a photodetectors.

BACKGROUND

High-speed optical transceivers are prevalent in datacenters. Germanium (Ge) waveguide photodetectors are key elements of these transceivers, implementing the functionality of converting the optical data streams into the electrical domain. To properly accomplish this functionality, the photodetectors should be efficient and fast.

The response speed of Ge photodetectors may be limited by the amount of time it takes for photogenerated carriers to travel across the absorption region of the photodetector and to reach the electrodes to deliver the photocurrent response, which may also be referred to as the transit time. The transit time may be improved by reducing the distance that the photogenerated carriers travel. For example, the width of the absorption region may be reduced to reduce the travel distance. Process limitations, however, limit how much the width of the absorption region may be reduced.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
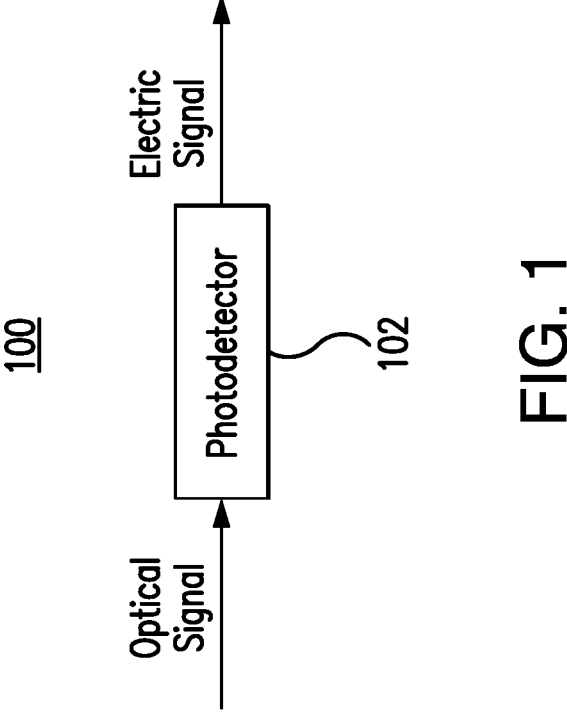
FIG. 1 illustrates an example optical system.

According to an embodiment, a photodetector includes a substrate, an optical absorber, a first doped region, a second doped region, and a third doped region. The optical absorber is disposed in the substrate and includes a first region and a second region that is more heavily doped than the first region. The first doped region is disposed in the substrate such that the first doped region contacts the second region of the optical absorber. The second doped region is disposed in the substrate such that the second doped region contacts the second region of the optical absorber. The second region of the optical absorber is positioned between the first doped region and the second doped region. The third doped region is disposed in the substrate and has an opposite doping relative to the first doped region and the second doped region. The first region of the optical absorber is positioned between the third doped region and the second region of the optical absorber.

According to another embodiment, a method includes directing an optical signal through an optical absorber disposed in a substrate. The optical absorber includes a first region and a second region that is more heavily doped than the first region. The method also includes directing a positive charge in the optical absorber towards a first doped region disposed in the substrate and a second doped region disposed in the substrate. The first doped region and the second doped region contact the second region of the optical absorber. The second region of the optical absorber is positioned between the first doped region and the second doped region. The method further includes directing a negative charge in the optical absorber towards a third doped region disposed in the substrate. The third doped region has an opposite doping relative to the first doped region and the second doped region. The first region of the optical absorber is positioned between the third doped region and the second region of the optical absorber.

According to another embodiment, a photodetector includes a substrate, a first optical absorber, a second optical absorber, a first doped region, and a second doped region. The first optical absorber is disposed in the substrate and includes a first region and a second region that is more heavily doped than the first region. The second optical absorber is disposed in the substrate and includes a third region and a fourth region that is more heavily doped than the third region. The first doped region is disposed in the substrate such that the first doped region contacts the second region of the first optical absorber and the fourth region of the second optical absorber. The second doped region is disposed in the substrate and has an opposite doping relative to the first doped region. The first region of the first optical absorber is positioned between the second doped region and the second region of the first optical absorber. The third region of the second optical absorber is positioned between the second doped region and the fourth region of the second optical absorber.

Example Embodiments

The present disclosure describes a photodetector (e.g., a Germanium (Ge) photodetector) with improved transit times, in certain embodiments. Generally, the photodetector includes an optical absorber, an anode, and a cathode. Unlike existing devices in which the anode and the cathode are both positioned on opposite, lateral sides of the absorber, one of the anode or the cathode is positioned beneath the absorber in the stack, and the other is positioned near the top of the absorber (e.g., on the sides of the absorber near the top of the absorber). In this manner, the distance that a photogenerated carrier travels may be reduced by reducing the height of the absorber rather than its width. As a result, process limitations that limit how much the width of the absorber may be reduced do not impact the reduction in travel distance, in certain embodiments.

FIG. 1 illustrates an example optical system 100. As seen in FIG. 1, the optical system 100 includes a photodetector 102 that converts an optical signal into an electric signal. The photodetector 102 includes an optical absorber region through which the optical signal propagates. As the optical signal propagates through the absorber region, the optical signal separates positively charged carriers from negatively charged electrons in the absorber region. These carriers may be directed through electrical components to produce the electric signal. The speed of the photodetector 102 is affected by the distance that these carriers travel to reach the electric components. This disclosure describes various designs for the photodetector 102 that reduce the travel distance of the carriers, in certain embodiments.

Figure 2A:
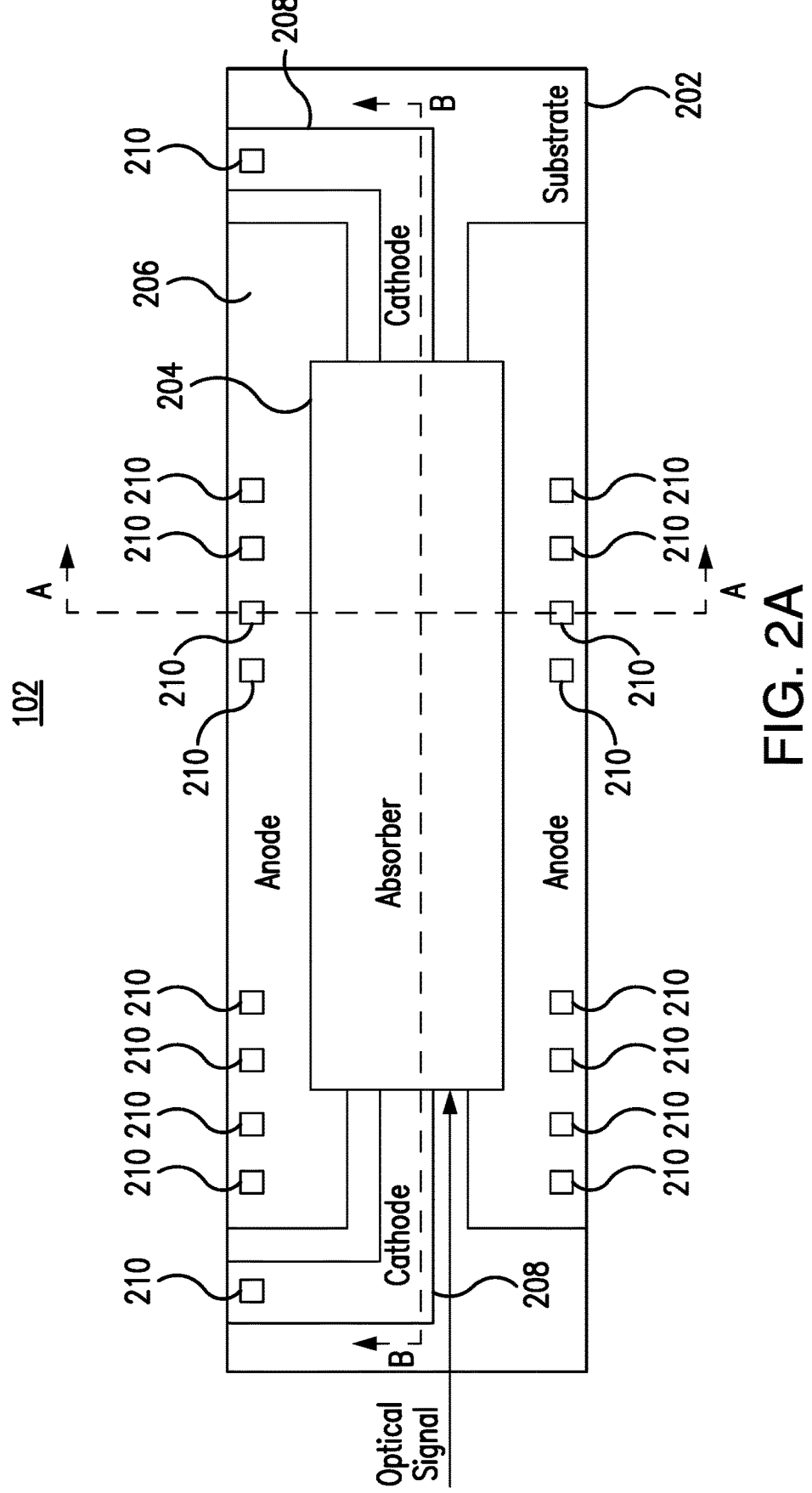
FIGS. 2A, 2B, and 2C illustrate an example photodetector in the optical system of FIG. 1.
Figure 2B:
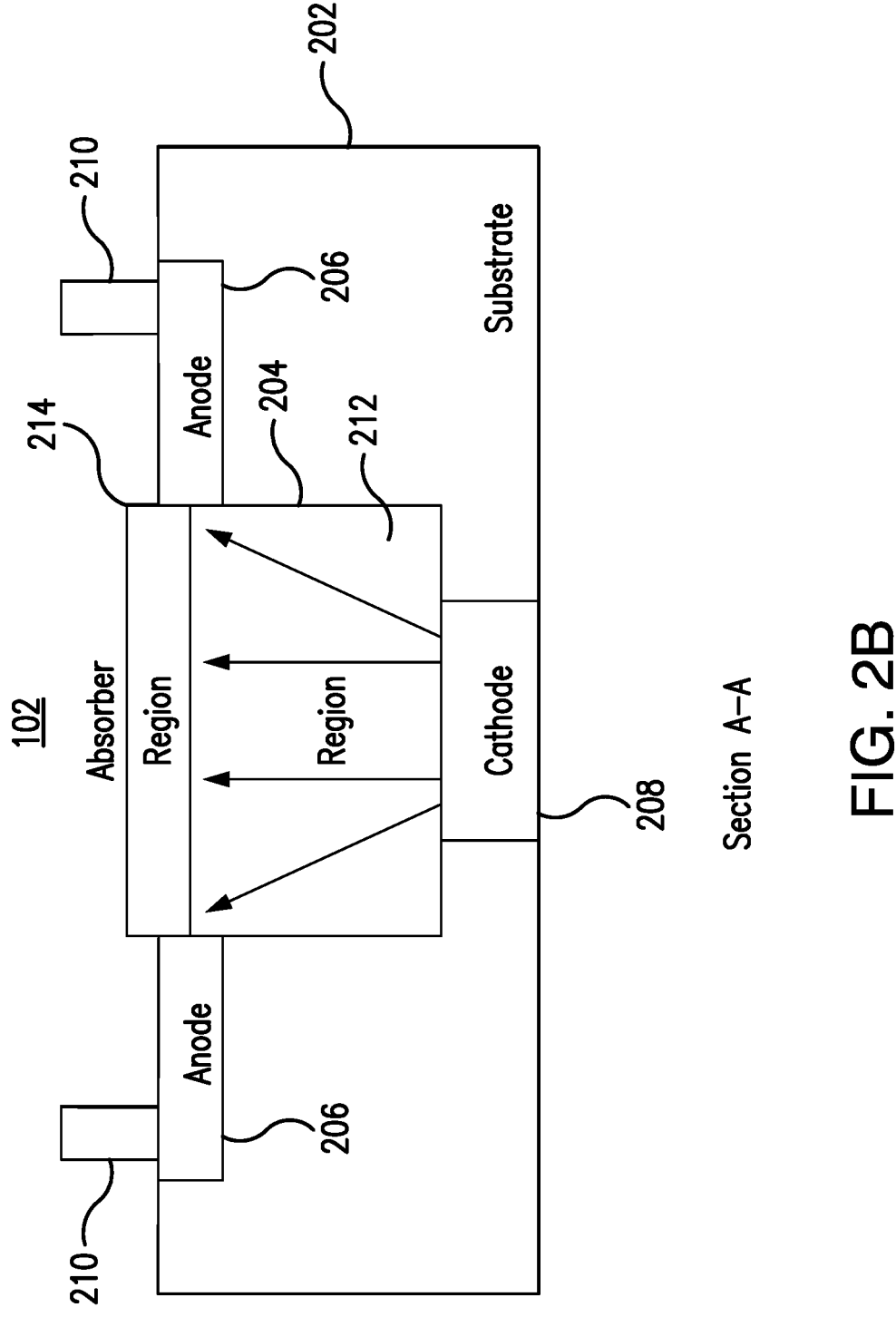
Figure 2C:
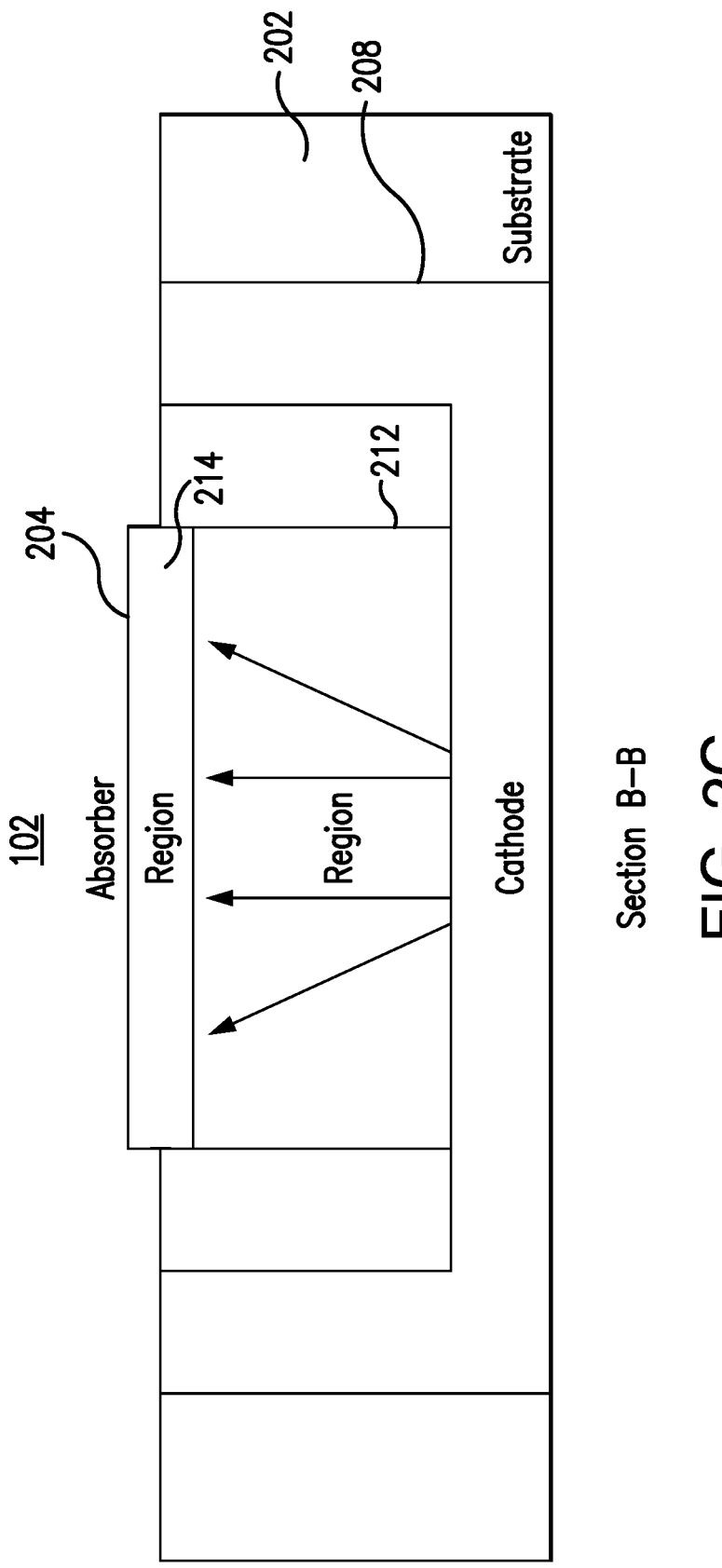

FIGS. 2A, 2B, and 2C illustrate an example photodetector 102 in the optical system 100 of FIG. 1. FIG. 2A illustrates a view of the photodetector 102 from the top down. As seen in FIG. 2A, the photodetector 102 includes a substrate 202, an optical absorber 204, one or more anodes 206, a cathode 208, and one or more electrodes 210. The absorber 204, anode 206, and cathode 208 are arranged such that the height of the absorber 204 may be reduced to reduce the travel distance of photogenerated carriers in the absorber 204. As a result, the design of the photodetector 102 improves the speed of the photodetector 102, in certain embodiments.

The substrate 202 forms a foundation for the other components of the photodetector 102. For example, the absorber 204, anode 206, and the cathode 208 may be arranged on, above, or within the substrate 202. The substrate 202 may be formed using any suitable material (e.g., silicon).

The absorber 204 may be a doped region positioned above or within the substrate 202. The absorber 204 may be formed using any suitable material (e.g., germanium). In some embodiments, the absorber 204 includes regions with different amounts of doping. For example, the absorber 204 may include a first region with a first level of doping and a second region that is more heavily doped than the first region.

An optical signal may be directed through the absorber 204 in a direction parallel to the cathode 208 beneath the absorber 204 to generate separate positively charged carriers and negatively charged electrons in the absorber 204. The photogenerated carriers may travel from a portion of the absorber 204 that is closer to the cathode 208 towards another portion of the absorber 204 that is closer to the anode 206. Additionally, the movement of the carriers towards the anode 206 generates the electric signal produced by the photodetector 102. In certain embodiments, the design of the photodetector 102 allows the height of the absorber 204 to be reduced to reduce the travel distance of these carriers, which improves the speed of the photodetector 102.

The anode 206 and the cathode 208 may be positioned near opposite ends of the absorber 204. Generally, the anode 206 and the cathode 208 may be highly doped regions in the substrate 202. For example, the anode 206 and the cathode 208 may be heavily doped silicon regions. These doped regions may implement tunnel junctions to the film (e.g., germanium film) in the absorber 204 allowing extraction of carriers and electrons. In certain embodiments, the anode 206 is positioned near the top of the absorber 204, and the cathode 208 is positioned near the bottom of the absorber 204. In other embodiments, the anode 206 is positioned beneath the absorber 204, and the cathode 208 is positioned near the top of the absorber 204. Importantly, the positioning of the anode 206 and the cathode 208 differs from existing designs in which the anode 206 and the cathode 208 are positioned on opposite, lateral sides of the absorber 204. Because the anode 206 and the cathode 208 are positioned near opposite vertical ends of the absorber 204, the travel distance for the photogenerated carriers in the absorber 204 may be reduced by reducing the height of the absorber 204 rather than the width.

Any suitable type of doping may be used to form the regions 212 and 214 of the absorber 204, the anode 206, and the cathode 208. For example, the regions 212 and 214 may be p-type doped. The anode 206 may be p-type doped. The cathode 208 may be n-type doped.

The electrodes 210 may be metal contacts formed on or in the anode 206 and the cathode 208. As seen in FIG. 2A, multiple electrodes 210 are formed in the anode 206 at opposite ends of the anode 206. Additionally, multiple electrodes 210 may be formed on opposite ends of the cathode 208. The electrodes 210 carry the photogenerated carriers away from the photodetector 102. Connections may be made to the electrodes 210 to receive or extract the electric signal from the photodetector 102.

In some embodiments, as a result of the positioning of the absorber 204, the cathode 208, the anode 206, and the electrodes 210, there is no direct metal contact to the absorber 204. Rather, the contacts are made on the substrate 202 and to the absorber 204 through tunnel junctions.

FIG. 2B illustrates an example cross-section of the photodetector 102 shown in FIG. 2A. Specifically, FIG. 2B shows the cross-section A-A shown in FIG. 2A. As seen in FIG. 2B, the absorber 204 is formed on, above, or within substrate 202. The absorber 204 includes a region 212 and a region 214. The region 214 is positioned above the region 212. Additionally, the region 214 is more heavily doped than the region 212. For example, the region 212 may include doped germanium, and the region 214 may include more heavily doped germanium. In certain embodiments, the region 212 may include doped germanium and the region 214 includes more heavily doped germanium. In some embodiments, the region 212 includes undoped germanium or not intentionally doped germanium.

The anode 206 is formed on or within the substrate 202 near the upper portion of the absorber 204. In the example of FIG. 2B, the anode 206 contacts the region 214 of the absorber 204 on opposite, lateral sides of the region 214. In some embodiments, the anode 206 is a doped region that establishes a contact to the region 214 through a shallow tunnel junction in the substrate 202, which allows an equipotential surface to form parallel to the surface with low Ohmic drop and good carrier transport properties.

The cathode 208 is formed on or within the substrate 202 beneath the absorber 204. The cathode 208 contacts the bottom of the absorber 204. Notably, the cathode 208 contacts the region 212 of the absorber 204 but not the region 214 of the absorber 204. The cathode 208 may be oppositely doped from the anode 206. For example, if the anode 206 is p-type doped, the cathode 208 is n-type doped. The cathode 208 forms a tunnel junction in the center of the substrate 202. The cathode 208 is routed beneath the absorber 204 and extends past the lateral sides of the absorber 204. The cathode 208 is then routed towards the side of the photodetector 102 where electrodes 210 may be attached to the cathode 208. In some embodiments, the electrodes 210 may be formed far from the absorber 204, which limits scattering losses in the photodetector 102.

As a result of this arrangement of the anode 206 and the cathode 208, when the optical signal passes through the absorber 204, the photogenerated carriers travel towards the anode 206 and the negatively charged electrons travel towards the cathode 208. As a result, an electric field is produced in the absorber 304. As seen in FIG. 2B, the electric field is arranged vertically in the absorber 204 from the region 212 towards the region 214. Thus, the travel distance of the photogenerated carriers and the electrons may be reduced by reducing the height of the absorber 204 rather than the width of the absorber 204.

The electrodes 210 are formed or disposed on the anode 206. Connections may be made to the electrodes 210 to extract the electric signal from the photodetector 102.

FIG. 2C illustrates another cross-section of the photodetector 102 shown in FIG. 2A. Specifically, FIG. 2C shows the cross-section B-B shown in FIG. 2A. As seen in FIG. 2C, the absorber 204 is disposed on, above, or in the substrate 202. The absorber 204 includes the region 212 and the region 214. The region 214 may be formed above the region 212, and the region 214 may be more heavily doped than the region 212.

Additionally, the cathode 208 is positioned beneath the absorber 204 and extends beyond the lateral ends of the absorber 204. Past the lateral ends of the absorber 204, the cathode 208 bends towards the top or the side of the substrate 202. As a result, electrical connections may be made to the cathode 208 beyond the lateral ends of the absorber 204.

As seen in FIG. 2C, the cathode 208 contacts the region 212 but not the region 214 of the absorber 204. When the optical signal travels through the absorber 204, the photo-generated carriers travel from the region 212 towards the region 214 and the electrons travel towards the cathode 208. As a result of positioning the cathode 208 beneath the absorber 204, the travel distance of the carriers and the electrons may be reduced by reducing the height of the absorber 204, in certain embodiments.

As discussed previously, process limitations may limit how much the width of the absorber 204 may be reduced, which prevents the travel distance in the absorber 204 from being reduced past a certain point if the carriers and electrons in the absorber 204 traveled laterally across the width of the absorber 204. In the described embodiments, the absorber 204, the anode 206, and the cathode 208 are designed such that the carriers and electrons in the absorber 204 travel vertically across the height of the absorber 204 rather than the width. As a result, the travel distance may be reduced by reducing the height of the absorber 204, which may not be susceptible to the same process limitations as reductions in the width of the absorber 204. In some embodiments, the height of the absorber 204 is reduced such that the width of the absorber 204 is greater than the height. For example, the width of the absorber 204 may be greater than 500 nanometers while the height of the absorber 204 is around 250 nanometers.

Figure 3A:
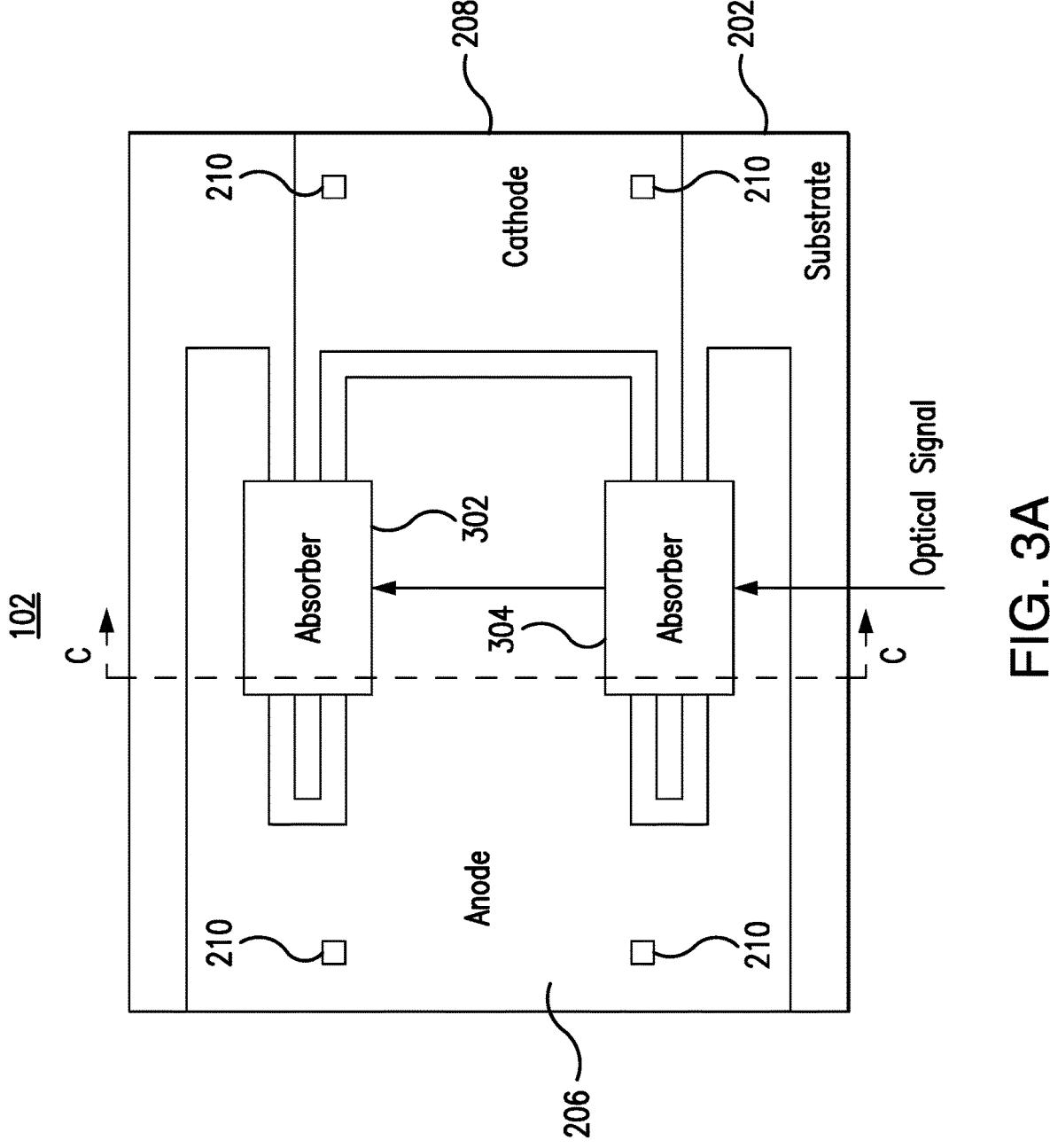
FIGS. 3A and 3B illustrate an example photodetector in the optical system of FIG. 1.
Figure 3B:
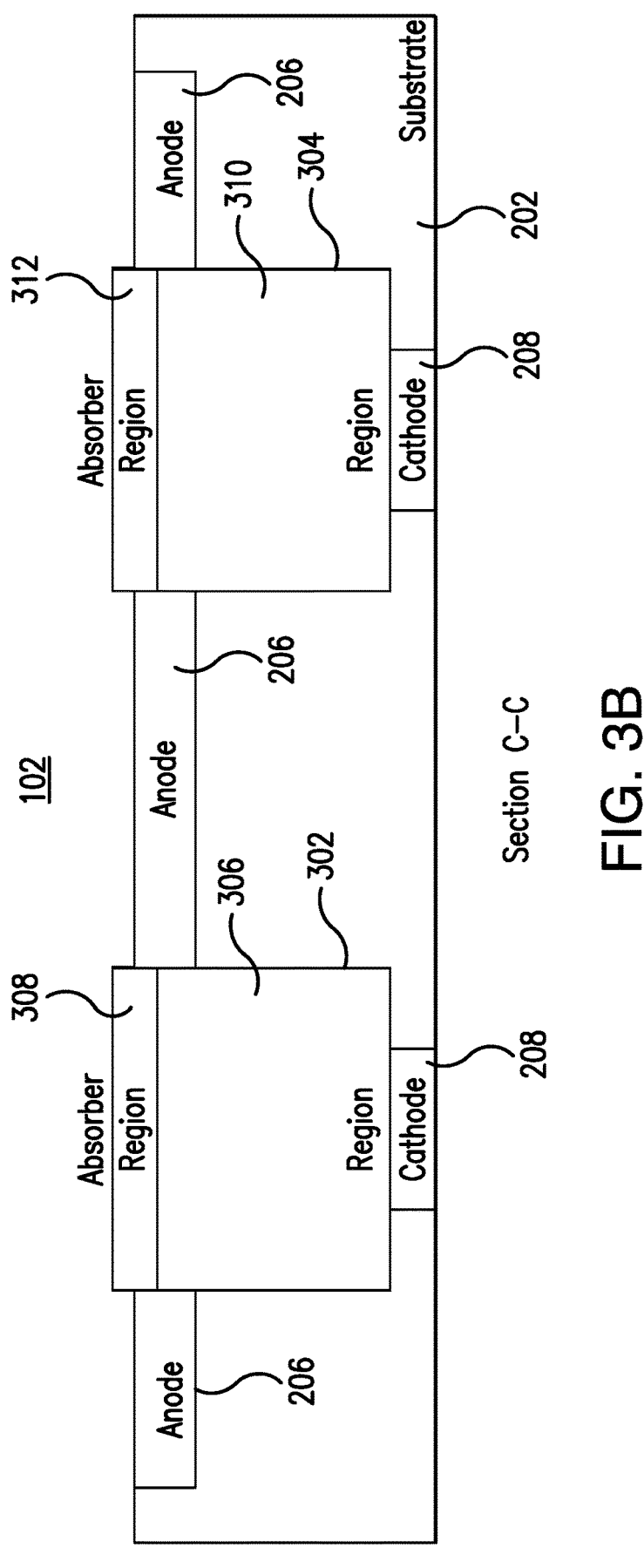

FIGS. 3A and 3B illustrate an example photodetector 102 in the optical system 100 of FIG. 1. Generally, the example photodetector 102 in FIGS. 3A and 3B differs from the example photodetector in FIGS. 2A, 2B, and 2C in that the example photodetector 102 in FIGS. 3A and 3B has multiple optical absorber regions. These absorber regions may be physically separated from each other in the photodetector 102 along the direction of propagation of an optical signal. The optical signal may be directed through both absorber regions to separate electrons and positively charged carriers in both regions. The carriers may then travel towards an anode and the electrons may travel towards a cathode to produce an electric signal. In some embodiments, the length of each separated absorber region along the direction of propagation may be shorter, which may reduce the parasitics (e.g., series resistance) of an electrode (e.g., cathode or anode) buried beneath the absorber regions.

FIG. 3A illustrates an example photodetector 102 in the optical system 100 of FIG. 1. Generally, FIG. 3A provides a top-down view of the photodetector 102. As seen in FIG.

3A, the photodetector 102 includes an absorber 302 and an absorber 304 that are physically separated from each other in the photodetector 102. An optical signal is directed through both the absorber 302 and the absorber 304.

The photodetector 102 includes a substrate 202 that forms the foundation of the components in the photodetector 102. The absorber 302, the absorber 304, the anode 206, and the cathode 208 may be formed on, above, or within the substrate 202. The substrate 202 may be formed using any suitable material (e.g., silicon).

The absorbers 302 and 304 are formed on, above, or within the substrate 202. Each absorber 302 and 304 may include a first region and a second, more heavily doped region. The absorbers 302 and 304 are positioned along the direction of propagation of the optical signal and are physically separated from one another. As the optical signal travels through the absorbers 302 and 304, positively charged carriers are separated from negatively charged electrons in the absorbers 302 and 304. The carriers may be directed towards the anode 206 and the electrons may be directed towards the cathode 208 to produce an electric signal.

The anode 206 is formed on, above, or within the substrate 202 and has fingers that extend towards the absorbers 302 and 304. As seen in FIG. 3A, the fingers of the anode 206 extend across the surfaces of the absorbers 302 and 304 in the line of propagation of the optic signal. Specifically, the anode 206 may occupy a space between the absorbers 302 and 304 and may extend across the surfaces of the absorbers 302 and 304 that face each other. The anode 206 also extends across the surfaces opposite the surfaces that face each other. The anode 206 may be formed near the upper regions of the absorber 302 and the absorber 304. In some embodiments, the tunnel junctions formed by the anode 206 run perpendicular to the propagation direction of the optical signal.

The cathode 208 may be formed on, above, or within the substrate 202. Generally, the cathode 208 is positioned at an opposite end of the substrate 202 as the anode 206. The cathode 208 also includes fingers that extend towards the absorber 302 and the absorber 304. As seen in FIG. 3A, each finger of the cathode 208 extends towards and underneath the absorbers 302 and 304. The fingers may extend past the width of the absorbers 302 and 304. The fingers then connect with the bottom of the absorbers 302 and 304. As a result, the cathode 208 connects to the absorbers 302 and 304 at the bottom of the absorbers 302 and 304, and the anode 206 connects to the absorbers 302 and 304 near the top of the absorbers 302 and 304. In some embodiments, the tunnel junctions formed by the cathode 208 run perpendicular to the propagation direction of the optical signal.

Electrodes 210 are formed on the anode 206 and the cathode 208. The electrodes 210 may be formed using any suitable, conductive material. Electric connections may be made to the electrodes 210 to extract the electric signal produced by the optical signal traveling through the absorbers 302 and 304.

FIG. 3B illustrates an example cross-section of the photodetector 102 in FIG. 3A. Specifically FIG. 3B shows the cross-section C-C shown in FIG. 3A. As seen in FIG. 3B, the absorber 302 and the absorber 304 are formed on, above, or within the substrate 202. The absorber 302 includes a region 306 and a region 308 formed above the region 306. The region 308 is more heavily doped than the region 306. For example, the region 306 may include doped germanium and the region 308 may include more heavily doped germanium. The absorber 304 includes a region 310 and a region 312 formed above the region 310. The region 312 is more heavily doped than the region 310. For example, the region 310 may include doped germanium, and the region 312 may include more heavily doped germanium. The absorbers 302 and 304 are physically separated from each other.

The anode 206 is disposed on, above, or within the substrate 202. The anode 206 is positioned near the top of the absorbers 302 and 304. The anode 206 contacts the upper regions 308 and 312 of the absorbers 302 and 304. As seen in FIG. 3B, the anode 206 is formed on either side of the absorbers 302 and 304 and between the absorbers 302 and 304. The anode 206 extends across the space between the absorbers 302 and 304 and contacts the regions 308 and 312.

The cathode 208 is disposed on or within the substrate 202. The cathode 208 may be formed beneath the absorbers 302 and 304 such that the cathode 208 contacts the regions 306 and 310 of the absorbers 302 and the 304. The cathode 208 may not contact the top, more heavily doped regions 308 and 312 of the absorbers 302 and 304. As a result, positively charged carriers in the absorbers 302 and 304 will tend to travel upwards towards the anode 206, and negatively charged electrons in the absorbers 302 and 304 will tend to travel downwards towards the cathode 208.

When the optical signal propagates through the absorbers 302 and 304, positively charged carriers are separated from negatively charged electrons in the absorbers 302 and 304. The carriers may travel towards the cathode 208 and the electrons may travel towards the anode 206. As a result, a substantially vertical electric field is generated in each absorber 302 and 304. In certain embodiments, the travel distance of the carriers and the electrons may be reduced by reducing the heights of the absorber 302 and the absorber 304, rather than by reducing the widths. By reducing the travel distance, the speed of the photodetector 102 may be improved.

Process limitations may limit how much the width of the absorbers 302 and 304 may be reduced, which prevents the travel distance in the absorbers 302 and 304 from being reduced past a certain point if the carriers and electrons in the absorbers 302 and 304 traveled laterally across the width of the absorbers 302 and 304. In the described embodiments, the absorbers 302 and 304, the anode 206, and the cathode 208 are designed such that the carriers and electrons in the absorbers 302 and 304 travel vertically across the height of the absorbers 302 and 304 rather than the width. As a result, the travel distance may be reduced by reducing the height of the absorbers 302 and 304, which may not be susceptible to the same process limitations as reductions in the width of the absorbers 302 and 304. In some embodiments, the height of the absorbers 302 and 304 is reduced such that the width of the absorbers 302 and 304 is greater than the height.

Figure 4:
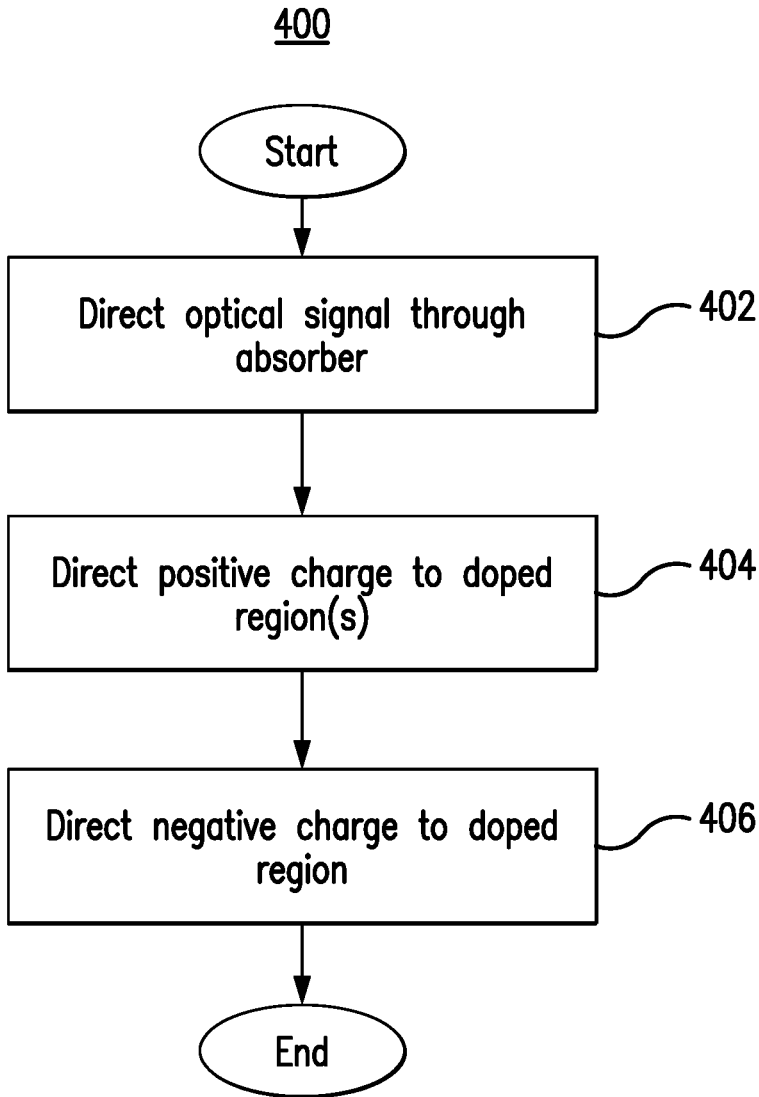
FIG. 4 is a flowchart of an example method performed in the optical system of FIG. 1.

FIG. 4 is a flowchart of an example method 400 performed in the optical system 100 of FIG. 1. Certain components of the photodetector 102 may perform the steps of the method 400. By performing the method 400, the photodetector 102 may convert an optical signal into an electric signal, in certain embodiments.

In step 402, an optical signal is directed through an optical absorber 204 of the photodetector 102. In certain embodiments, an optical source, such as a laser diode, may emit the optical signal. The optical signal may be directed towards the absorber 204 of the photodetector 102. As the optical signal propagates through the absorber 204, positively charged carriers may be separated from negatively charged electrons within the absorber 204.

In step 404, the absorber 204 directs the carriers towards a doped region 214 in the absorber 204 and towards one or more anodes 206 positioned near the top of the absorber 204.

The positively charged carriers may travel to the anode 206 that contacts the region 214 of the absorber 204. In step 406, the negatively charged electrons in the absorber 304 are directed towards a cathode 208 positioned beneath the absorber 204. The cathode 208 may contact the region 212 in the absorber 204 but not the more heavily doped region 214. As a result, of the movement of the positively charged carriers and the negatively charged electrons towards opposite ends of the absorber 204, the photodetector 102 may produce an electric signal through the anode 206 and the cathode 208. In certain embodiments, because the anode 206 and the cathode 208 are positioned vertically with respect to each other in the photodetector 108, the travel distance of the carriers and the electrons may be reduced by reducing the height of the absorber 204.

In another embodiment, a photodetector 102 with split absorbers 302 and 304 may perform the method 400. In these embodiments, the optical signal may be directed through both absorbers 302 and 304, which may be physically separated from each other and positioned along the direction of propagation of the optical signal. An anode 206 may extend across the widths of these absorbers 302 and 304. The anode 206 may also contact upper regions 308 and 312 of the absorbers. A cathode 208 may also extend across the widths of these absorbers 302 and 304. The cathode 208 may be routed beneath the absorbers 302 such that the cathode 208 connects to lower regions 306 and 310 of the absorbers 302 and 304. As a result, the positively charged carriers in these absorbers 302 and 304 travel towards the anode 206 near the top of the absorbers 302 and 304, and the negatively charged electrons in these absorbers 302 and 304 travel towards the cathode 208 at the bottom of the absorbers 302 and 304.

In summary, a photodetector 102 (e.g., a Germanium (Ge) photodetector) includes an absorber 204, an anode 206, and a cathode 208. Unlike existing devices in which the anode and the cathode are both positioned on opposite, lateral sides of the absorber, one of the anode 206 or the cathode 208 is positioned beneath the absorber 204 in the stack, and the other is positioned near the top of the absorber 204 (e.g., on the sides of the absorber 204 near the top of the absorber 204). In this manner, the distance that a photogenerated carrier travels may be reduced by reducing the height of the absorber 204 rather than its width. As a result, process limitations that limit how much the width of the absorber 204 may be reduced do not impact the reduction in travel distance, in certain embodiments.

Process limitations may limit how much the width of the absorber 204 may be reduced, which prevents the travel distance in the absorber 204 from being reduced past a certain point if the carriers and electrons in the absorber 204 traveled laterally across the width of the absorber 204. In the described embodiments, the absorber 204, the anode 206, and the cathode 208 are designed such that the carriers and electrons in the absorber 204 travel vertically across the height of the absorber 204 rather than the width. As a result, the travel distance may be reduced by reducing the height of the absorber 204, which may not be susceptible to the same process limitations as reductions in the width of the absorber 204. In some embodiments, the height of the absorber 204 is reduced such that the width of the absorber 204 is greater than the height. For example, the width of the absorber 204 may be greater than 500 nanometers while the height of the absorber 204 is around 250 nanometers.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A photodetector comprising:
a substrate;
an optical absorber disposed in the substrate, wherein the optical absorber comprises a first region and a second region that is more heavily doped than the first region;
a first doped region disposed in the substrate such that the first doped region contacts the second region of the optical absorber;
a second doped region disposed in the substrate such that the second doped region contacts the second region of the optical absorber, wherein the second region of the optical absorber is positioned between the first doped region and the second doped region; and
a third doped region disposed in the substrate, wherein the third doped region has an opposite doping relative to the first doped region and the second doped region, and wherein the first region of the optical absorber is positioned between the third doped region and the second region of the optical absorber, and wherein the first doped region and the second doped region are positioned closer to the second region than the third doped region is to the second region.

2. The photodetector of claim 1, wherein the optical absorber comprises a germanium film.

3. The photodetector of claim 1, wherein the optical absorber, the first doped region, the second doped region, and the third doped region are arranged such that an electron in the optical absorber flows towards the third doped region.

4. The photodetector of claim 1, wherein the third doped region extends past opposite sides of the first doped region.

5. The photodetector of claim 1, wherein an optical signal is directed through the optical absorber in a direction that is parallel to the third doped region.

6. The photodetector of claim 1, wherein a width of the optical absorber from the first doped region to the second doped region is longer than a height of the optical absorber from the third doped region through the second region of the optical absorber.

7. The photodetector of claim 1, wherein the second region of the optical absorber, the first doped region, and the second doped region are p-type doped.

8. The photodetector of claim 1, further comprising:
a first metal contact electrically coupled to the first doped region;
a second metal contact electrically coupled to the second doped region; and
a third metal contact electrically coupled to the third doped region.

9. A method comprising:
directing an optical signal through an optical absorber disposed in a substrate, wherein the optical absorber comprises a first region and a second region that is more heavily doped than the first region;
directing a positive charge in the optical absorber towards a first doped region disposed in the substrate and a second doped region disposed in the substrate, wherein the first doped region and the second doped region contact the second region of the optical absorber, and wherein the second region of the optical absorber is positioned between the first doped region and the second doped region; and
directing a negative charge in the optical absorber towards a third doped region disposed in the substrate, wherein the third doped region has an opposite doping relative to the first doped region and the second doped region, wherein the first region of the optical absorber is positioned between the third doped region and the second region of the optical absorber, and wherein the first doped region and the second doped region are positioned closer to the second region than the third doped region is to the second region.

10. The method of claim 9, wherein the optical absorber comprises a germanium film.

11. The method of claim 9, wherein the optical absorber, the first doped region, the second doped region, and the third doped region are arranged such that an electron in the optical absorber flows towards the third doped region.

12. The method of claim 9, wherein the third doped region extends past opposite sides of the first doped region.

13. The method of claim 9, wherein the optical signal is directed through the optical absorber in a direction that is parallel to the third doped region.

14. The method of claim 9, wherein a width of the optical absorber from the first doped region to the second doped region is longer than a height of the optical absorber from the third doped region through the second region of the optical absorber.

15. The method of claim 9, wherein the second region of the optical absorber, the first doped region, and the second doped region are p-type doped.

16. The method of claim 9, wherein:
a first metal contact is electrically coupled to the first doped region;
a second metal contact is electrically coupled to the second doped region; and
a third metal contact is electrically coupled to the third doped region.

17. A photodetector comprising:
a substrate;
a first optical absorber disposed in the substrate, wherein the first optical absorber comprises a first region and a second region that is more heavily doped than the first region;
a second optical absorber disposed in the substrate, wherein the second optical absorber comprises a third region and a fourth region that is more heavily doped than the third region;

a first doped region disposed in the substrate such that the first doped region contacts the second region of the first optical absorber and the fourth region of the second optical absorber; and a second doped region disposed in the substrate, wherein the second doped region has an opposite doping relative to the first doped region, wherein the first region of the first optical absorber is positioned between the second doped region and the second region of the first optical absorber, wherein the third region of the second optical absorber is positioned between the second doped region and the fourth region of the second optical absorber, and wherein the first doped region is positioned closer to the second region of the first optical absorber and the fourth region of the second optical absorber than the second doped region is to the second region and the fourth region.

18. The photodetector of claim 17, wherein the first optical absorber comprises a germanium film.

19. The photodetector of claim 17, wherein an optical signal is directed through the first optical absorber in a direction that is perpendicular to the first doped region and the second doped region.

20. The photodetector of claim 17, wherein the first doped region and the second doped region extend past opposite ends of the first optical absorber.

* * * * *